(12) United States Patent
Sevic et al.

(10) Patent No.: US 6,297,700 B1
(45) Date of Patent: Oct. 2, 2001

(54) RF POWER TRANSISTOR HAVING CASCADED CELLS WITH PHASE MATCHING BETWEEN CELLS

(75) Inventors: John F. Sevic; Christopher J. Knorr, both of Los Gatos; James R. Parker, Cupertino; Howard D. Bartlow, Palo Alto, all of CA (US)

(73) Assignee: UltraRF, Inc., Sunnyvale, CA (US)

( * ) Notice: Subject to any disclaimer, the term of this patent is extended or adjusted under 35 U.S.C. 154(b) by 0 days.

(21) Appl. No.: 09/507,123

(22) Filed: Feb. 18, 2000

(51) Int. Cl.[7] ............................ H01L 23/48; H01L 27/10; H01L 29/76
(52) U.S. Cl. .................... 330/277; 330/302; 330/307; 257/203; 257/365; 257/368; 257/664; 257/773; 257/784; 257/786
(58) Field of Search ................................ 330/277, 302, 330/307; 257/203, 365, 368, 664, 773, 784, 786

(56) References Cited

U.S. PATENT DOCUMENTS 4,408,219 * 10/1983 Resneau .......................... 257/664
5,233,310 * 8/1993 Inoue ............................ 330/277
5,949,106 * 9/1999 Kai et al. ....................... 257/786
6,023,080 * 2/2000 Kojima .......................... 257/276

FOREIGN PATENT DOCUMENTS

63240077 * 5/1988 (JP) .

OTHER PUBLICATIONS

Miscellaneous Abstract re Phase Effect on Parallel Transistors, Oct. 8, 1999, pp. 1–11. Henry K. Woodward.

* cited by examiner

*Primary Examiner*—Michael B Shingleton
(74) *Attorney, Agent, or Firm*—Townsend and Townsend and Crew LLP; Henry K. Woodward

(57) ABSTRACT

The power delivered by an RF power transistor having cascaded cells or unit elements is improved by reducing the phase imbalance between elements and thereby reducing transverse effects between cells. Phase imbalance is reduced by varying the number of transistor elements connected to interconnect areas, connecting wire bonds to an input transmission line concentrated near an outer edge in the transmission line to take advantage of surface skin effects on current, and varying the surface area of the interconnect areas to adjust input impedance and output impedance of each cell.

14 Claims, 9 Drawing Sheets

RF POWER TRANSISTOR HAVING CASCADED CELLS WITH PHASE MATCHING BETWEEN CELLS

BACKGROUND OF THE INVENTION

This invention relates generally to RF power transistors, and more particularly the invention relates to improving performance of an RF transistor having multiple cascaded transistor cells by reducing phase offsets between the cells.

A power transistor typically comprises a plurality of transistor cells or unit elements in a semiconductor die with the cells connected in parallel for amplifying an input signal. FIG. 1 is a plan view of a conventional power transistor in a semiconductor die 10 and including a plurality of cells 12. For an LDMOS transistor, each cell includes a plurality of interdigitated drain 14 and gate 16 elements with wire bonding pads 18 and 20 respectively connected to drains 14 and gate 16 through metallization 22 and 24 as shown in FIG. 2. FIG. 3 is a schematic of the LDMOS transistor cell in which the source comprises the grounded semiconductor substrate, and FIG. 4 is a section view of one LDMOS gate and drain structure in the substrate 10 for an n-channel transistor.

As shown schematically in FIG. 5, the wire bonds connected to the gate input and to the drain output have associated input inductance 28 and output inductance 30 which combine with parasitic input capacitance 32 and output capacitance 34 to modify input and output impedances. FIG. 6 is a plan view illustrating an input transmission line 40, input wire leads 42 from transmission line 40 to bonding pads 20 of cells 12, and wire leads 44 from bonding pads 18 to output transmission line 46.

For wireless phone applications, signals with short wavelengths (up to the GHz range) must be amplified. Heretofore, the multicell LDMOS transistor has performed satisfactorily for frequencies up to 1 GHz. See FIG. 7 which illustrates gate width versus CW power capability. For the 1 GHz curve 50, a linear relationship exists between gate width and power. However, 2 GHz curve 52 shows a nonlinear effect where the cascading of additional cells produces a lesser increase in power.

The present invention is directed to providing a power transistor amplifier with improved power and performance capability.

SUMMARY OF THE INVENTION

We have discovered that the loss of performance, when cascading transistor unit elements in the frequency ranges where electrical length is on the same order as the physical length, stems from phase mismatch across the transverse direction of the die whereby destructive interference occurs between the unit elements and thus reduces performance.

In accordance with the invention, phase mismatch between cells or unit elements in a cascaded transistor is reduced to improve performance of the cascaded transistor. In one embodiment of the invention, inner unit elements of the cascaded array of elements have fewer transistor elements connected to bonding pads than do outer transistor elements. This physical shaping of the transistor cells in a bow tie configuration reduces the total gate width of the inner elements but produces improved performance by reducing phase mismatch between the inner elements and the outer elements. Additionally, input and output capacitance for each cell can be varied which alters input and output impedances of each cell, i.e. presenting a different impedance in some cells helps to phase match the signals across the transistor die.

In accordance with another embodiment of the invention, skin effects of input and output transmission lines which can cause an unbalance of current and voltage in a transmission line are overcome by use of wire bonds to the input and output transmission lines that are preferably concentrated near outer edges of the transmission lines where transverse electrical lengths are on the order of the physical lengths. Thus, each cell in the cascaded array can receive in-phase currents and in-phase voltages.

The invention and objects and features thereof will be more readily apparent from the following detailed description and dependent claims when taken with the drawings.

DESCRIPTION OF ILLUSTRATIVE EMBODIMENTS

Figure 1:
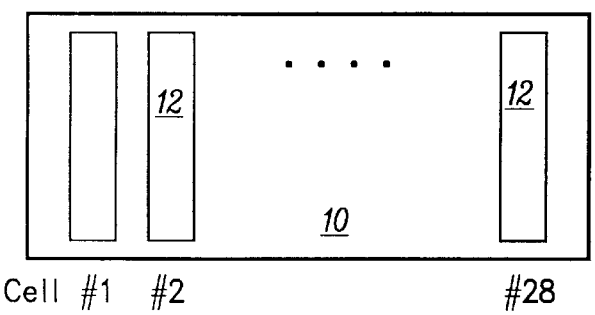
FIG. 1 is a plan view of an RF power transistor having cascaded cells in accordance with the prior art.
Figure 2:
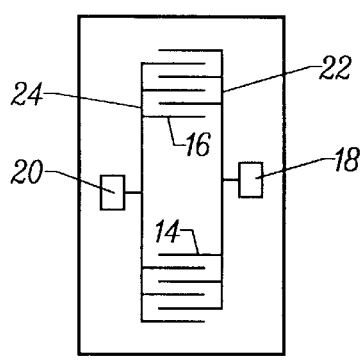
FIG. 2 is a plan view illustrating the interconnection of transistor elements in a cell of FIG. 1.
Figure 3:
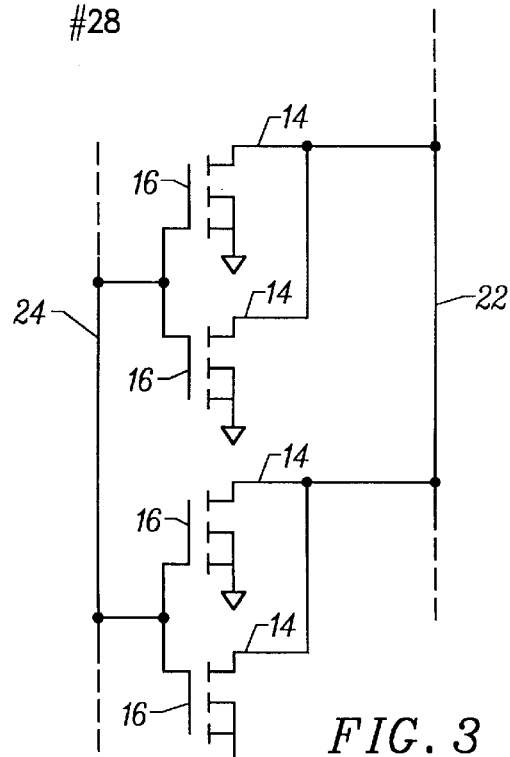
FIG. 3 is a schematic of adjacent transistor elements in a cell of FIG. 2.
Figure 4:
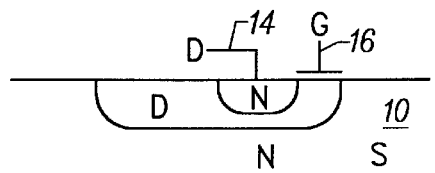
FIG. 4 is a section view illustrating the construction of a transistor element in the cell of FIGS. 2 and 3.
Figure 6:
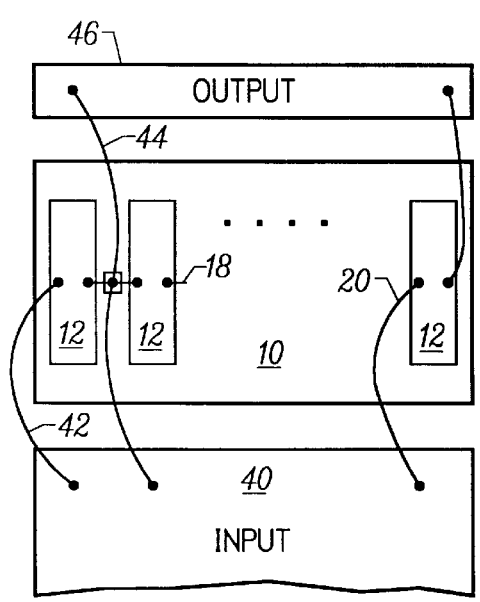
FIG. 6 is a plan view illustrating the interconnection of an input transmission and an output transmission line with the cells of FIG. 1.
Figure 5:
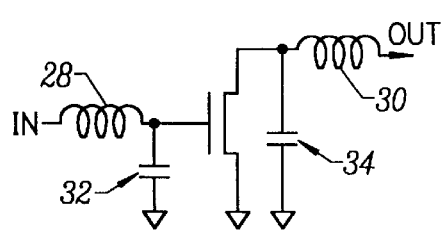
FIG. 5 is an electrical schematic of a transistor element of FIGS. 2–4.
Figure 7:
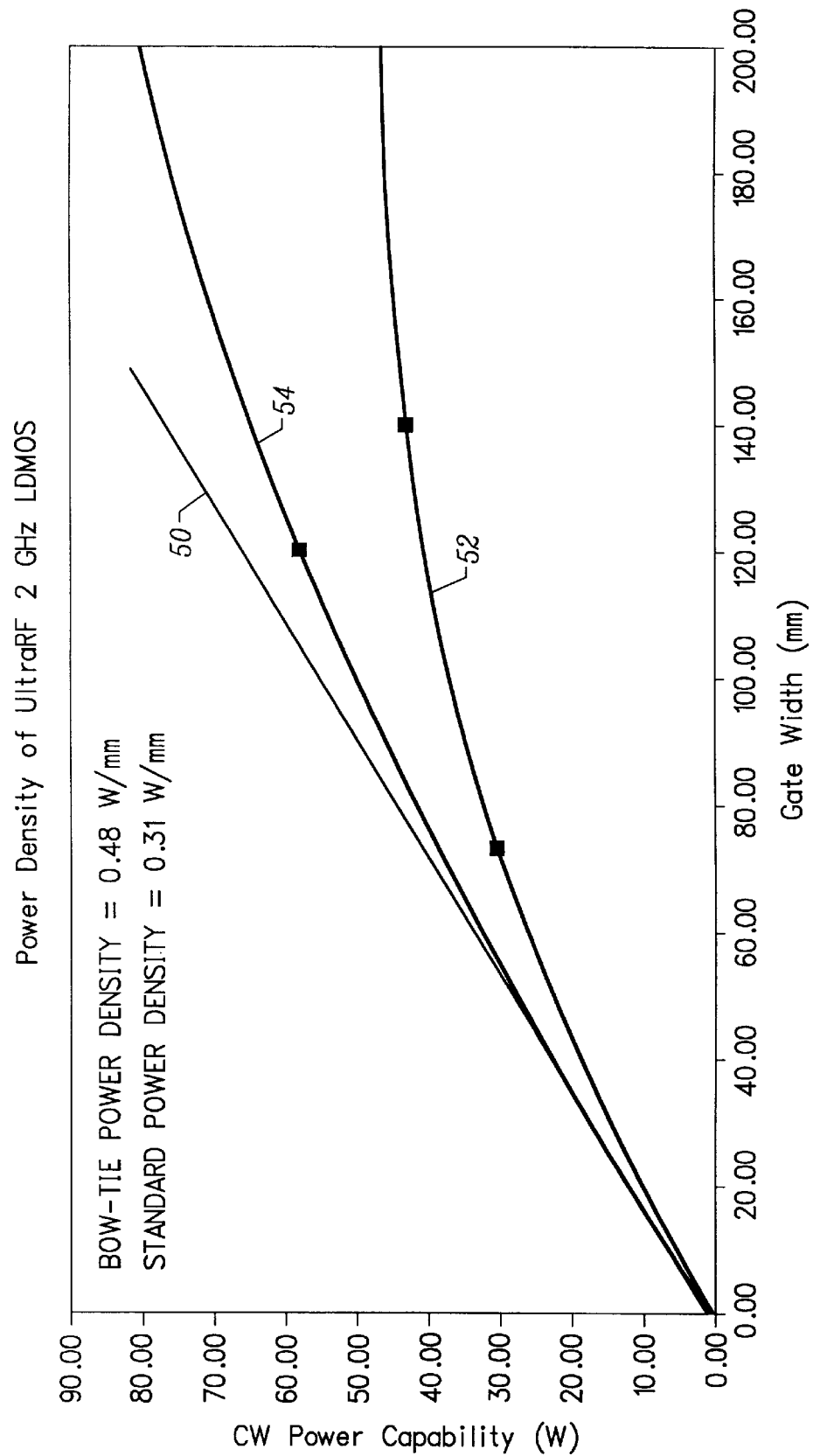
FIG. 7 is a graph illustrating CW power capacity of a conventional multiple cell tranistor and a multiple cell transistor in accordance with the invention.

In accordance with the invention phase differences arising from transverse effects in an RF power transistor are reduced to improve the performance of the transistor/amplifier. In FIG. 7 curve 54 illustrates the improved output power with a multicell transistor in accordance with one embodiment of the invention operating at 2 GHz, as compared with the output power for the conventional cell illustrated by curve 52. Although less than the linear output at 50 for a transistor operating at 1 GHz, the invention provides marked improvement at 2 GHz.

For an LDMOS power transistor as described above, the reduction in phase differences can be accomplished by changing the effective gate width among the cells. Further, the invention provides a fan bond lead connection for the transistor elements in each cell, shapes the surface area of bonding pads in the cell to alter input and output capacitances, and/or changes the placement of wire leads from the bonding pads to the input and output transmission lines or matching capacitors to help overcome skin effects.

Figure 8:
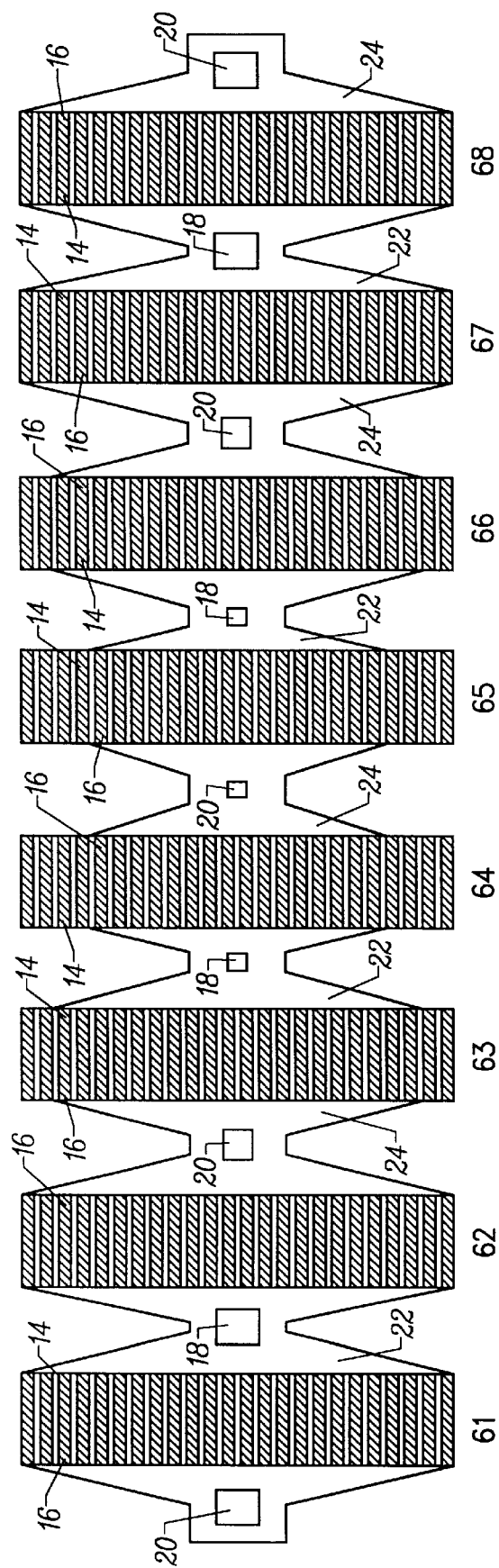
FIG. 8 is a plan view illustrating the interconnection of circuit cells in accordance with an embodiment of the present invention.

FIG. 8 is a plan view illustrating the variation in gate widths within cells. For illustration purposes only eight cells are illustrated, cells 61, 62, 63, 64, 65, 66, 67, and 68. It will be appreciated that adjacent cells have a reverse pattern whereby gate electrodes 16 face each other in adjacent cells and drain electrodes 14 face each other in adjacent cells whereby the interconnect lines 22, 24 connect drains and gates in adjacent cells, respectively.

The inner cells 64, 65 have fewer drain and gate elements interconnected by the leads 22, 24 thereby reducing the effective gate widths of these cells as compared to the gate widths of the outer cells 61, 62, 67, 68 in which all gate and drain elements are interconnected by the leads 22, 24. The resulting bow tie configuration of the cells tends to reduce phase offset between adjacent cells. Further, it will be noted that the wire bond pads 18, 20 may vary in size from the outer cells 61, 68 to the inner cells 63, 64, 65, thereby varying the input and output parasitic capacitance of the bond pads. Accordingly, the input impedance and output impedance of the cells can be adjusted as necessary to reduce phase offset between cells.

Figure 9:
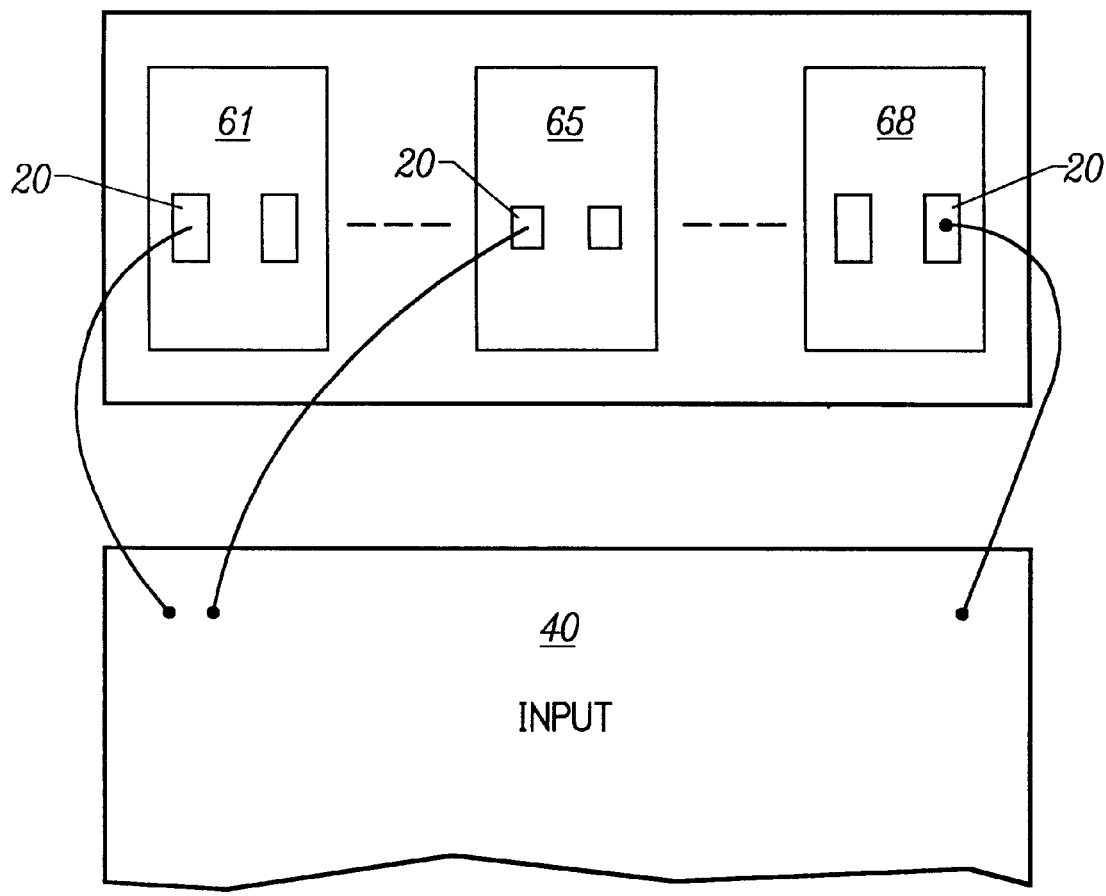
FIG. 9 is a plan view illustrating bonding pads in circuit cells and the interconnection of bonding pads to an input transmission line in accordance with an embodiment of the invention.

Referring now to FIG. 9, in accordance with another feature of the invention the wires interconnecting gate bond pads 20 and the input transmission line 40 are bunched together near the outer edges of input transmission line 40 to take advantage of the skin effect and the higher current density at the edges of transmission line 40. Again, it will be noted that the gate bonding pads 20 in cells 61, 65, 68 may vary in size to adjust the input impedance of the cells as described above.

In accordance with one embodiment of the invention in which 28 cells are on one die with each cell having 80 gate fingers and 40 drain fingers, the number of gate fingers interconnected in each cell to provide a bow tie configuration of the cascaded cells is as follows:

| Cell # | # Gate Fingers | Gate Width (microns) |
| --- | --- | --- |
| 1 | 80 | 4912 |
| 2 | 78 | 4789.2 |
| 3 | 76 | 4666.4 |
| 4 | 74 | 4543.6 |
| 5 | 72 | 4420.8 |
| 6 | 70 | 4298 |
| 7 | 68 | 4175.2 |
| 8 | 68 | 4175.2 |
| 9 | 66 | 4052.4 |
| 10 | 64 | 3929.6 |
| 11 | 62 | 3806.8 |
| 12 | 60 | 3684 |
| 13 | 58 | 3561.2 |
| 14 | 56 | 3438.4 |
| 15 | 56 | 3438.4 |
| 16 | 58 | 3561.2 |
| 17 | 60 | 3684 |
| 18 | 62 | 3806.8 |
| 19 | 64 | 3929.6 |
| 20 | 66 | 4052.4 |
| 21 | 68 | 4175.2 |
| 22 | 68 | 4175.2 |
| 23 | 70 | 4298 |
| 24 | 72 | 4420.8 |
| 25 | 74 | 4543.6 |
| 26 | 76 | 4666.4 |
| 27 | 78 | 4789.2 |
| 28 | 80 | 4912 |

Figure 10A:
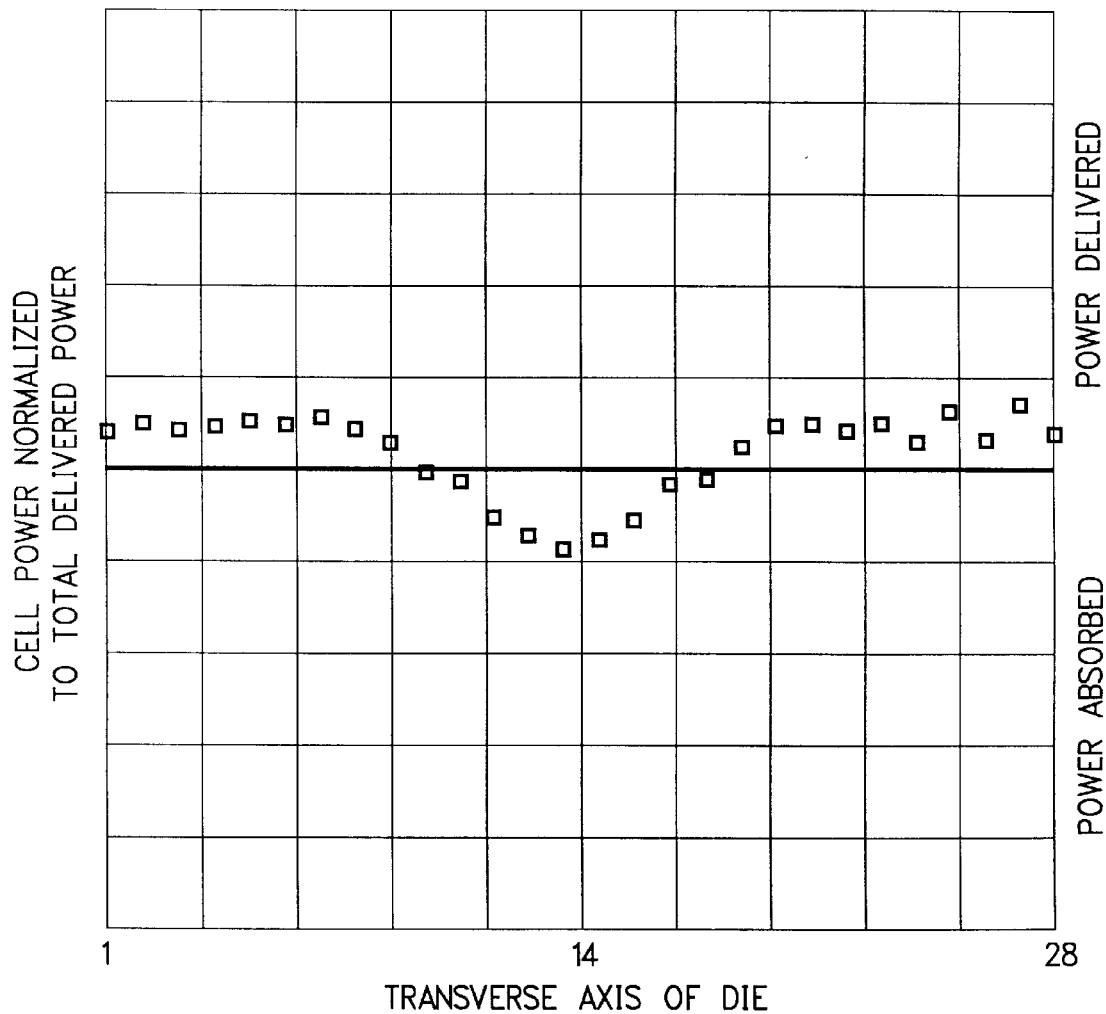
FIGS. 10A–10E illustrate normalized cell power for transistor cells which are physically shaped in accordance with the invention.
Figure 10B:
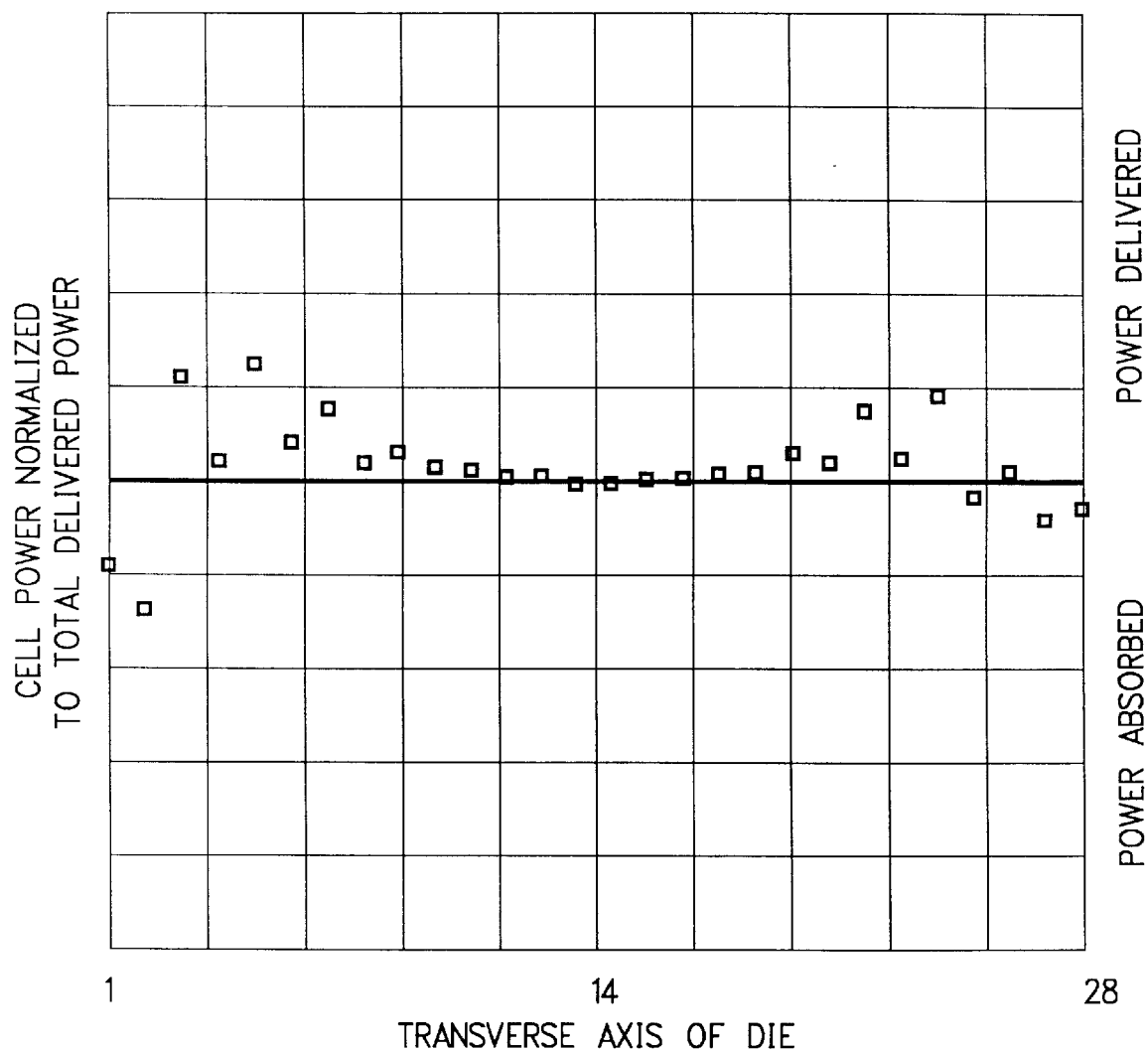
Figure 10C:
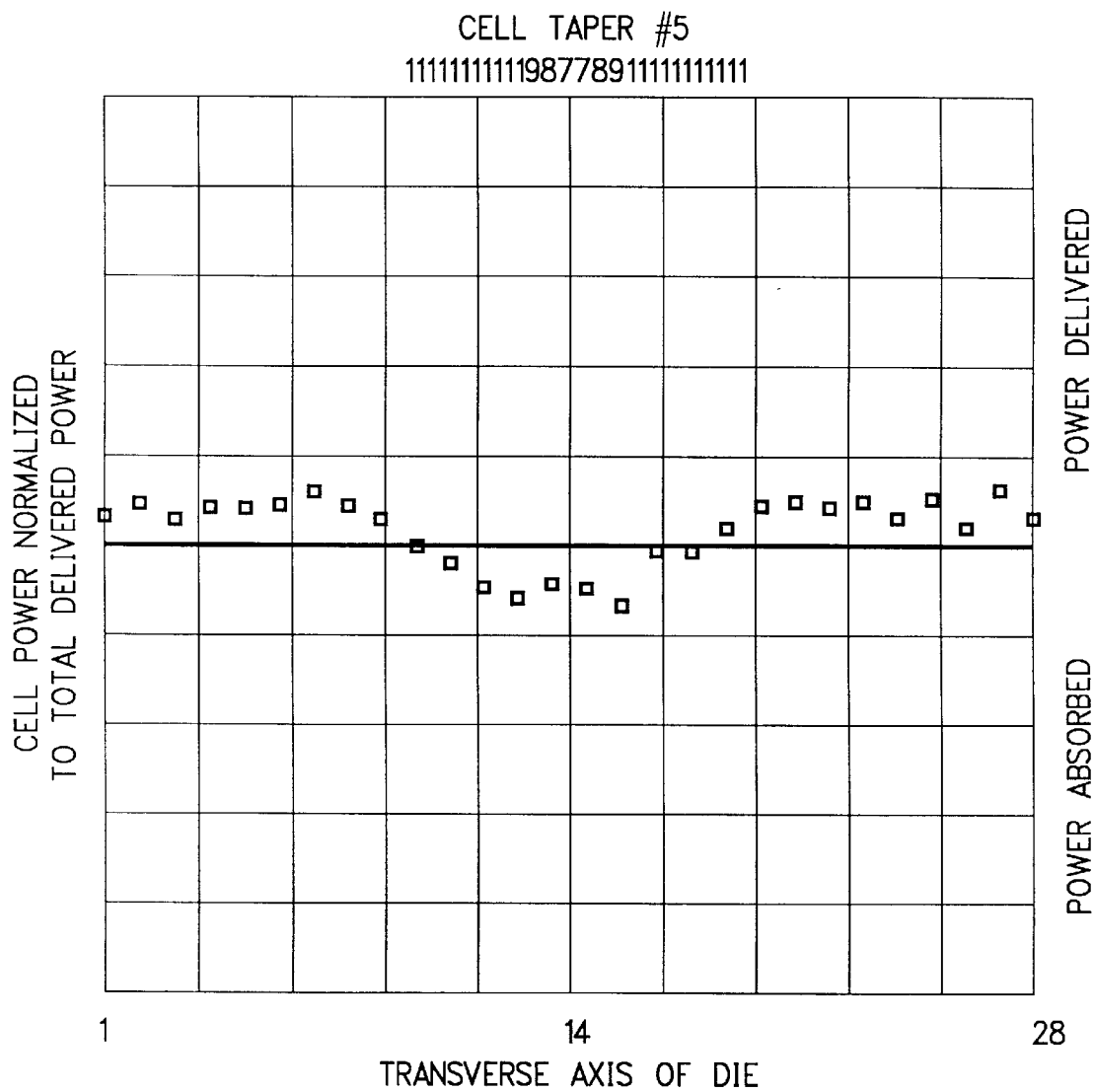
Figure 10D:
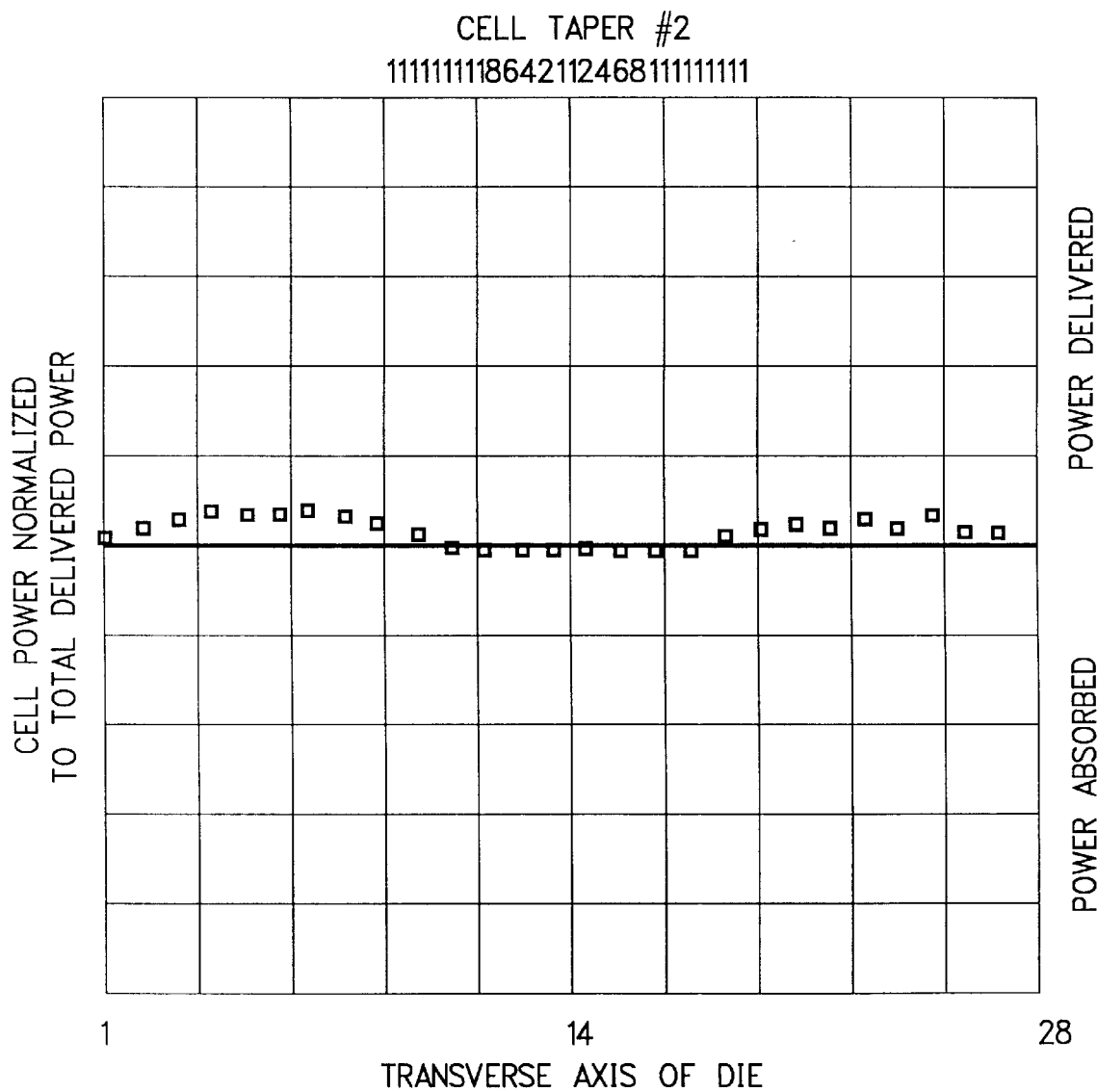
Figure 10E:
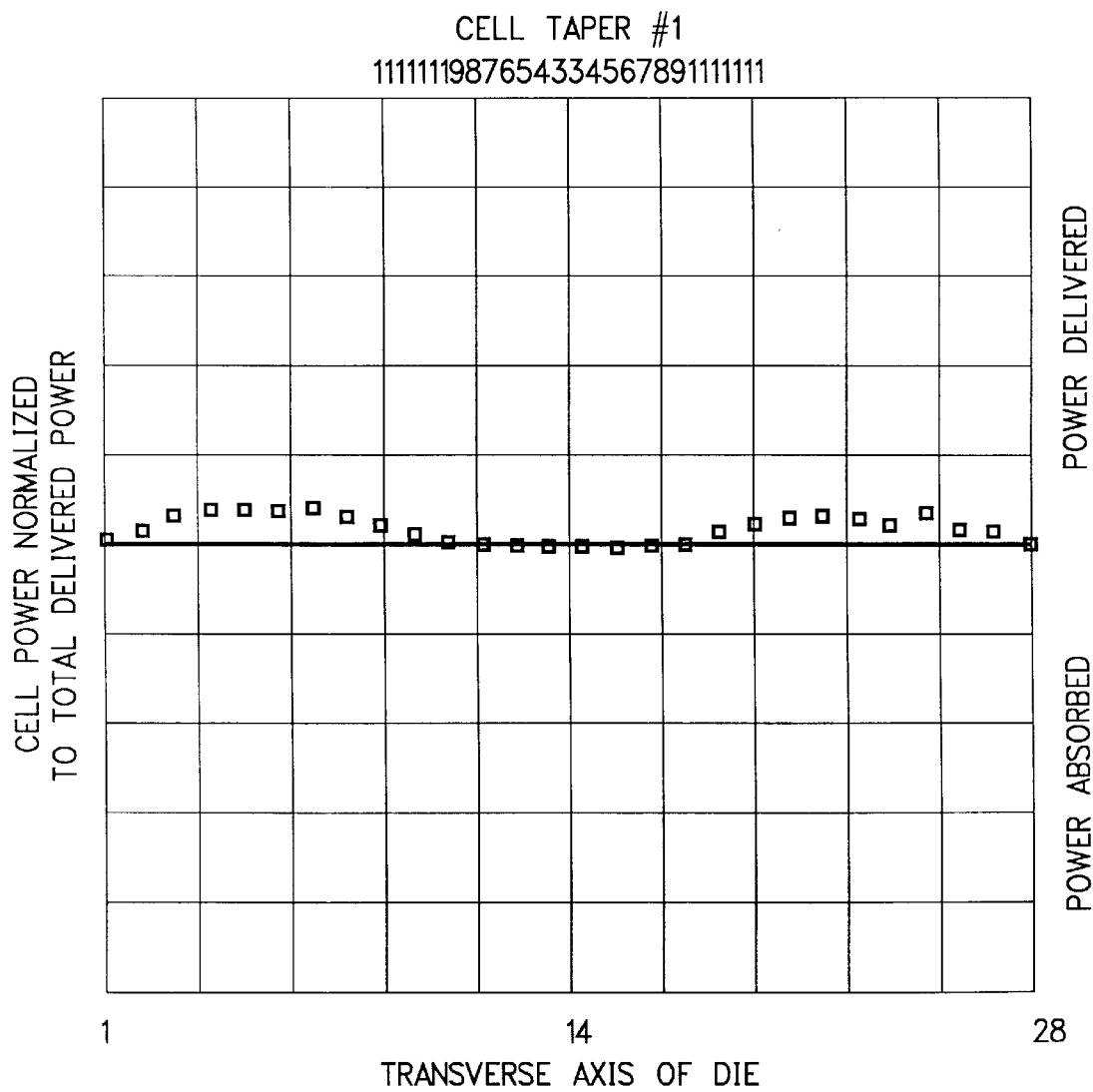

FIGS. 10A–10E are plots illustrating cell power normalized to total delivered power for various cell tapers in a 28-cell transistor die, with "1" equal 100% and "3" representing 30% of transistor elements interconnected within a cell. The bow tie tapers as illustrated in FIGS. 10D and 10E have more uniform cell power with no absorbed power as compared to the no taper illustrated in FIG. 10A or the linear taper as illustrated in FIG. 10C. Accordingly, uniformity of delivered power is enhanced and absorbed power is reduced or eliminated using the bow tie configuration in accordance with the invention.

While the invention has been described with reference to specific embodiments, the description is illustrative of the invention and is not to be construed as limiting the invention. For example, the invention is applicable to arbitrary device structures such as bipolar junction transistors, MESFETS, HBTs, PHEMT, HFETs, SITs, and other arbitrary material systems such as SiC, GaAs, In Ga P. The invention is applicable to flip-chips and ball grid arrays, for example, as well as wire bonded chips. Thus, various modifications and applications may occur to those skilled in the art without departing from the true spirit and scope of the invention as defined by the appended claims.

What is claimed is:

1. An RF power amplifier comprising
   an input transmission line having a plurality of wire bonding sites,
   an output transmission line having a plurality of wire bonding sites,
   a semiconductor body having a plurality of transistor elements, each element having a plurality of input transistor components and a plurality of output transistor components, and an input interconnect and an output interconnect, the transistor elements being linearly arranged with outer elements and inner elements
   whereby the transistor cells are configured to balance the phase of the cell inputs and cell outputs to reduce absorbed power and increase total power of the amplifier.

2. The amplifier as defined by claim 1 wherein the inner elements have fewer transistor components connected to the interconnects than do outer transistor elements.

3. The amplifier as defined by claim 2 and further including a plurality of bond wires connecting the input transmission line to input interconnects and a plurality of bond wires connecting the output transmission line to the plurality of output interconnects wherein wire bonds to the input transmission line are concentrated near outer edges of the input transmission line.

4. The amplifier as defined by claim 3 wherein the interconnects comprise bond pads which vary in surface area to vary input impedance and output impedance of each element.

5. The amplifier as defined by claim 4 wherein the bond pads vary in surface area to adjust input impedance and output impedance.

6. The amplifier as defined by claim 1 wherein the transistor elements are LDMOS transistors, the input transistor components are gates, and the output transistor components are drains.

7. An RF power transistor comprising a semiconductor body having a plurality of transistor elements, each element having a plurality of input transistor components and a plurality of output transistor components and an input bond area and an output bond area, the transistor elements being linearly arranged with outer elements and inner elements, whereby the transistor elements are configured to reduce phase differences of the element inputs and increase total power of the amplifier.

8. The RF power transistor as defined by claim 7 wherein inner elements have a different number of transistor components connected to the bond areas than do outer transistor elements.

9. The RF power transistor as defined by claim 8 wherein bond areas vary in surface area to adjust input impedance and output impedance of each cell.

10. The RF power transistor as defined by claim 9 wherein the transistor cells are LDMOS transistors and the transistor components are gates and drains of transistors.

11. A method of improving power output of an RF power transistor comprising the steps of
 a) providing a semiconductor die having a plurality of cascaded unit transistors, each unit having at least one input transistor element and at least one output transistor element, an input interconnect area and an output interconnect area, and
 b) reducing phase differences at the inputs across the unit transistors.

12. The method as defined by claim 11 wherein step b) includes providing inner units with fewer transistor elements connected to the interconnect areas than outer transistor units have.

13. The process as defined by claim 12 wherein interconnect areas vary in surface area to adjust input impedance and output impedance of each unit.

14. The method as defined by claim 11 wherein interconnect areas vary in surface area to adjust input impedance and output impedance of each unit.

* * * * *